United States Patent [19]

Matsuyama

[11] Patent Number: 4,718,044
[45] Date of Patent: Jan. 5, 1988

[54] ELECTRONIC APPARATUS HAVING PLURAL DETACHABLE MEMORIES

[75] Inventor: Shigeru Matsuyama, Yokohama, Japan

[73] Assignee: Canon Kabushiki Kaisha, Tokyo, Japan

[21] Appl. No.: 572,371

[22] Filed: Jan. 20, 1984

[30] Foreign Application Priority Data

Jan. 27, 1983 [JP] Japan .................... 58-10589

[51] Int. Cl.⁴ .............................. G11C 13/00
[52] U.S. Cl. ................................ 365/230
[58] Field of Search ............... 364/200, 900; 365/230, 365/189

[56] References Cited

U.S. PATENT DOCUMENTS

| | | | |
|---|---|---|---|
| 4,153,933 | 5/1979 | Blume, Jr. et al. | 364/200 |
| 4,368,515 | 1/1983 | Nielsen | 364/200 |
| 4,443,864 | 4/1984 | McElroy | 364/900 |
| 4,473,877 | 9/1984 | Tulk | 364/200 |

Primary Examiner—Thomas M. Heckler
Assistant Examiner—John G. Mills
Attorney, Agent, or Firm—Fitzpatrick, Cella, Harper & Scinto

[57] ABSTRACT

A personal computer or the like having plural detachable external memories wherein the efficiency of use of such external memories is improved by the fact that the addresses allotted to each of the plural external memories are rendered variable.

8 Claims, 2 Drawing Figures

1

ELECTRONIC APPARATUS HAVING PLURAL DETACHABLE MEMORIES

BACKGROUND OF THE INVENTION

1. Field of the Invention

The present invention relates to an electronic apparatus, such as a personal computer, with detachable external memories.

2. Description of the Prior Art

There is already known electronic apparatus such as a personal computer, which can be connected, through suitable connecting means, to two different external memories, one of which only requires relatively infrequent attachment/detachment and therefore a relatively inconvenient attaching/detaching mechanism can be tolerated while the other memory requires relatively easy attachment/detachment.

The former of such external memories is exemplified by a ROM chip or a RAM chip to be connected for example to an IC socket while the latter is exemplified by a RAM card with a backup battery.

SUMMARY OF THE INVENTION

An object of the present invention is to improve the mode of utilization of such external memories in such electronic apparatus.

Another object of the present invention is to provide a data processing apparatus provided with devices with allotted addresses, comprising addressing means for generating addresses, plural memory means with allotted addresses, and changing means for changing the addresses allotted to each of the plural memory means.

Still another object of the present invention is to provide an electronic apparatus comprising means for connecting plural detachable external memory means, and changing means for changing the addresses allotted to each of the plural external memory means connected to the connecting means.

Still another object of the present invention is to provide an electronic apparatus comprising addressing means for generating addresses, control means for controlling objects to be designated by the addresses generated by the addressing means; and means for changing the objects to be designated by the addressing means.

DETAILED DESCRIPTION OF THE PREFERRED EMBODIMENTS

Now, the present invention will be explained in greater detail by the following description which is to be taken in conjunction with the attached drawings.

Figure 1:
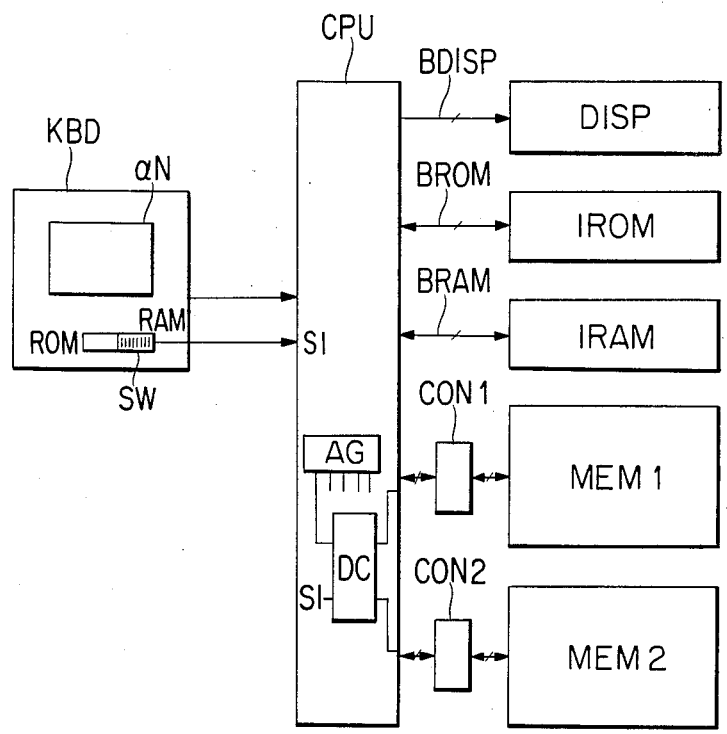
FIG. 1 is a block diagram showing an example of the electronic apparatus embodying the present invention.

FIG. 1 shows an embodiment of the structure of the electronic apparatus of the present invention, wherein shown are a keyboard KBD comprising alphanumeric keys $\alpha N$ and a switch SW for selecting whether an external memory MEM1 to be connected to a memory connector CON1 is a read-only memory (ROM) or a random access memory (RAM); a control unit CPU composed, for example, of a clock pulse generator, a sequence control circuit consisting of gates and other logic circuits, a register for various controls and processings, an address generator AG for generating addresses for the objects of control, a decoder DC for address change by the switch SW etc.; and a display unit DISP for displaying data supplied through a bus line BDISP.

An internal read-only memory IROM provided inside the electronic apparatus itself, with a memory capacity, for example, of 8 Kbytes, is connected to the control unit CPU through a bus line BROM and is used for storing micro-instructions for the control of various units by the control unit CPU, in the form of a program.

An internal random access memory IRAM provided inside the electronic apparatus itself, with a memory capacity, for example, of 8 Kbytes, stores data supplied by the control unit CPU through a bus line BRAM at addresses designated by address signals supplied by the control unit CPU through the bus line BRAM, and supplies data at designated addresses to the control unit CPU through the bus line BRAM.

A detachable external memory MEM1 connected to the control unit CPU through a connector CON1 is composed of a ROM chip or a RAM chip for example of 8 Kbytes. Another detachable external memory MEM2 connected to the control unit CPU through a connector CON2 is composed for example of a RAM card of 8 Kbytes with a backup battery.

Figure 2:
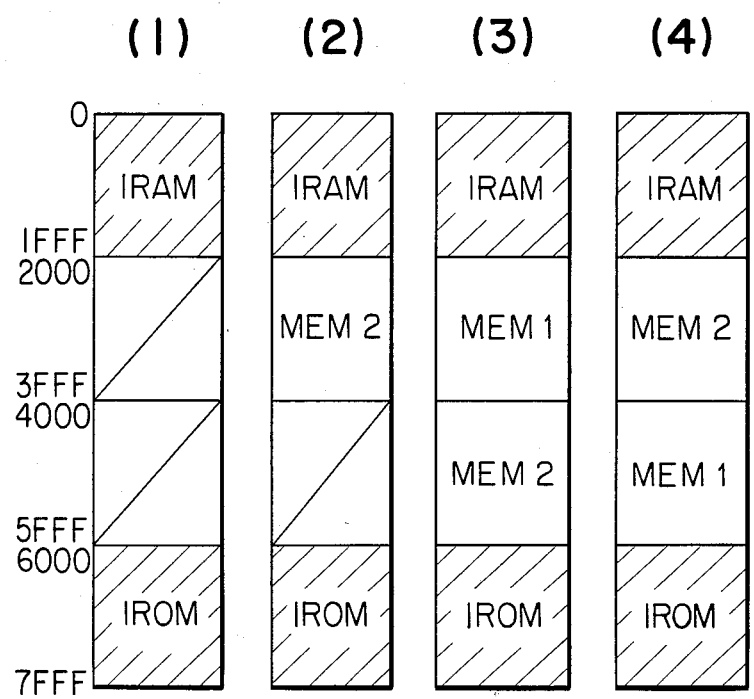
FIG. 2 (1) to (4) are address maps when external memories are connected to the electronic apparatus of the present invention.

Now, reference is made to FIG. 2 for explaining address assignment to the internal and external memories in the electronic apparatus of the present invention. In FIG. 2, (1) to (4) indicate address maps for the internal memories IRON, IRAM and external memories MEM1, MEM2 shown in FIG. 1, wherein addresses 6000H to 7FFFH and 0H to 1FFFH are respectively assigned to the internal memories IROM and IRAM.

In the following there will be explained the address assignment in case the external memories are connected to the electronic apparatus of the present invention through the connectors CON1 and CON2 in three combinations (2), (3) and (4) shown in FIG. 2.

At first, when the connector CON1 is not connected to the external memory MEM1 but the connector CON2 is connected to a RAM card as the external memory MEM2, as shown in FIG. 2 at (2), the control unit CPU detects the absence of the external memory MEM1 for example through the positioning of the switch SW at "ROM". Then, when the address generator AG generates addresses 2000H–3FFFH, the control unit CPU supplies the uppermost digit of the address to the decoder DC to generate, in combination with a signal S1 from the switch SW, an access signal to the external memory MEM2, thus supplying the remainder of the addresses 2000H–3FFFH to the external memory MEM2 through the connector CON2. In this manner the addresses 2000H–3FFFH are assigned to the external memory MEM2.

Now, there will be explained a case that the connector CON1 is connected to a RAM chip as the external memory MEM1 while the connector CON2 is connected to a RAM card as the external memory MEM2 and that the switch SW is set at "RAM". In such case the control unit CPU detects the positioning of the switch SW at "RAM", and in response to the decoder discriminates the uppermost digits of the addresses 2000H–3FFFH and 4000H–5FFFH supplied from the address generator AG and supplies the remaining digits of the addresses 2000H–3FFFH to the RAM chip constituting the external memory MEM1 and those of the addresses 4000H–5FFFH to the RAM card constituting the external memory MEM2. In this manner, as shown in FIG. 2 at (3), addresses 2000H–3FFFH and 4000H–5FFFH are, respectively, assigned to the external memories MEM1 and MEM2.

Now, there will be explained a case that the connector CON1 is connected to a ROM chip as the external memory MEM1 while the connector CON2 is connected to a RAM card as the external memory MEM2, and that the switch SW on the keyboard KBD is positioned at "ROM", as shown in FIG. 2 (4). In this case the control unit CPU detects the positioning of the switch SW and assigns, through the decoder DC, addresses 4000H–5FFFH and 2000H–3FFFH, respectively, to the external memories MEM1 and MEM2.

As explained in the foregoing, the present invention enables variable memory assignment to the external memories MEM1 and MEM2 according to whether the connector CON1 is connected to a ROM or RAM chip and according to the presence or absence of connection of external memories. It is therefore rendered possible to achieve continuous address assignment to the RAM area and, in case a RAM chip is connected to the connector CON1 with less frequent attachment/detachment, to assign, to the RAM chip, addresses continuous with those assigned to the internal memory IRAM, preferentially to the RAM card connected to the connector CON2, thus facilitating the concept of address space in programming.

What I claim is:

1. In an information processing apparatus having a central processing unit including input means and an addressable read-write memory, an address designator for plural detachable memories enabling said apparatus to handle different types of read-write or read only addressable memory means, comprising:
    addressable read-write memory means;
    reception means for receiving a different type of detachable memory means to be detachably disposed with respect to the information processing apparatus;
    discrimination means for discriminating the type of the detachable memory means; and
    allotment means for allotting the next succeeding address of said read-write memory means, to the detachable memory received by said reception means when said discrimination means determines it is a read-write memory, and for allotting an address not succeeding the address of said read-write memory, to the detachable memory means received by said reception means when said discrimination means determines it is a read only memory.

2. An information processing apparatus according to claim 1, wherein said reception means receives a plurality of independent memory meansof one or more types.

3. An information processing apparatus according to claim 1, wherein said discrimination means comprises switch means for discriminating a type of said detachable memory means.

4. In an information processing apparatus having a central processing unit including input means and an addressable read-write memory, an address designator for plural detachable read-write or read only addressable memory means enabling said apparatus to handle different types of said read-write or read only addressable memory means, comprising:
    reception means for detachably receiving said detachable read-write or read only addressable memory means;
    discrimination means for discriminating the types of said read-write or read only addressable memory means received by said reception means; and
    allotment means for allotting a different address to said read-write or read only addressable memory means, on the basis of a discrimination result of said discrimination means.

5. An information processing apparatus according to claim 4, wherein said reception means receives read-only memory means and read-write memory means.

6. An information processing aparatus according to claim 4, wherein said reception means receives a plurality of independent memory means of one or more types.

7. An information processing apparatus according to claim 4, wherein said discrimination means comprises switch means for disriminating the type of said detachable memory means.

8. An information processing apparatus according to claim 6, wherein said allotment means allots an address to said detachable memory means in accordance with the respective type of said plurality of independent memory means when a plurality of detachable memory means are received by said reception means.

* * * * *

UNITED STATES PATENT AND TRADEMARK OFFICE
CERTIFICATE OF CORRECTION

PATENT NO. : 4,718,044
DATED : January 5, 1988
INVENTOR(S) : SHIGERU MATSUYAMA

It is certified that error appears in the above-identified patent and that said Letters Patent is hereby corrected as shown below:

COLUMN 1

Line 18, "easy" should read --frequent--.

COLUMN 2

Line 64, "to" should be deleted.

COLUMN 3

Line 12, "FIG.2 (4)." should read
    --FIG. 2 at (4).--.
    Line 47, "memory" should read --memory means--.

COLUMN 4

Line 9, "meansof" should read --means of--.
    Line 34, "aparatus" should read --apparatus--.
    Line 39, "disriminating" should read
    --discriminating--.

Signed and Sealed this

Twenty-first Day of March, 1989

Attest:

DONALD J. QUIGG

Attesting Officer      Commissioner of Patents and Trademarks